United States Patent
Liu et al.

(10) Patent No.: US 10,301,580 B2
(45) Date of Patent: May 28, 2019

(54) STRIPPING COMPOSITIONS HAVING HIGH WN/W ETCHING SELECTIVITY

(71) Applicant: Versum Materials US, LLC, Tempe, AZ (US)

(72) Inventors: Wen Dar Liu, Chupei (TW); Yi-Chia Lee, Chupei (TW); Tianniu Chen, Westford, MA (US); William Jack Casteel, Jr., Fountain Hill, PA (US); Seiji Inaoka, Macungie, PA (US); Gene Everad Parris, Coopersburg, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 14/976,737

(22) Filed: Dec. 21, 2015

(65) Prior Publication Data
US 2016/0186105 A1 Jun. 30, 2016

Related U.S. Application Data

(60) Provisional application No. 62/097,647, filed on Dec. 30, 2014.

(51) Int. Cl.
| | |
|---|---|
| C11D 7/50 | (2006.01) |
| C11D 11/00 | (2006.01) |
| C11D 7/32 | (2006.01) |
| C11D 7/26 | (2006.01) |
| C11D 7/10 | (2006.01) |

(Continued)

(52) U.S. Cl.
CPC ........ *C11D 11/0047* (2013.01); *C11D 3/0073* (2013.01); *C11D 3/3947* (2013.01); *C11D 3/3956* (2013.01); *C11D 7/10* (2013.01); *C11D 7/265* (2013.01); *C11D 7/3209* (2013.01); *C11D 7/3245* (2013.01); *G03F 7/423* (2013.01); *G03F 7/425* (2013.01); *G03F 7/426* (2013.01); *H01L 21/02063* (2013.01); *H01L 21/31144* (2013.01); *H01L 21/32134* (2013.01)

(58) Field of Classification Search
CPC ..................... H01L 21/32134; C11D 11/0047
USPC ....................................................... 510/175
See application file for complete search history.

(56) References Cited

U.S. PATENT DOCUMENTS

| | | |
|---|---|---|
| 6,676,484 B2 | 1/2004 | Chopra |
| 2003/0087525 A1 | 5/2003 | Sinha et al. |

(Continued)

FOREIGN PATENT DOCUMENTS

| | | |
|---|---|---|
| JP | 9279189 A2 | 10/1997 |
| JP | 2005049752 A2 | 2/2005 |

(Continued)

*Primary Examiner* — Gregory E Webb
(74) *Attorney, Agent, or Firm* — Joseph D. Rossi; Anne B. Kiernan

(57) ABSTRACT

A composition for cleaning integrated circuit substrates, the composition comprising: water; an oxidizer comprising an ammonium salt of an oxidizing species; a corrosion inhibitor comprising a primary alkylamine having the general formula: $R'NH_2$, wherein R' is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent.

29 Claims, 2 Drawing Sheets

(51) Int. Cl.
*C11D 3/00* (2006.01)
*C11D 3/39* (2006.01)
*C11D 3/395* (2006.01)
*G03F 7/42* (2006.01)
*H01L 21/02* (2006.01)
*H01L 21/311* (2006.01)
*H01L 21/3213* (2006.01)

(56) References Cited

U.S. PATENT DOCUMENTS

| | | | |
|---|---|---|---|
| 2005/0079718 A1* | 4/2005 | Siddiqui | C09G 1/02 438/692 |
| 2007/0163618 A1 | 7/2007 | Kim et al. | |
| 2008/0261847 A1* | 10/2008 | Visintin | H01L 21/02079 510/176 |
| 2009/0014415 A1* | 1/2009 | Chelle | C09G 1/02 216/53 |
| 2009/0082240 A1 | 3/2009 | Nukui et al. | |
| 2010/0112728 A1* | 5/2010 | Korzenski | C09K 13/08 438/3 |
| 2011/0281436 A1 | 11/2011 | Inaba et al. | |
| 2013/0276284 A1* | 10/2013 | Brosseau | C22B 7/007 29/426.1 |
| 2014/0038420 A1* | 2/2014 | Chen | H01L 21/32134 438/754 |
| 2016/0185595 A1* | 6/2016 | Chen | H01L 21/02063 216/13 |

FOREIGN PATENT DOCUMENTS

| | | |
|---|---|---|
| JP | 2006210857 A2 | 8/2006 |
| TW | 200919120 A | 7/2007 |
| WO | 2007044446 A1 | 4/2007 |
| WO | 2012048079 A2 | 4/2012 |
| WO | 2013101907 A1 | 7/2013 |

* cited by examiner

STRIPPING COMPOSITIONS HAVING HIGH WN/W ETCHING SELECTIVITY

CROSS-REFERENCE TO RELATED APPLICATIONS

This application claims the benefit of priority under 35 U.S.C. § 119(e) to earlier filed U.S. patent application Ser. No. 62/097,647, filed on Dec. 30, 2014, the disclosure of which is incorporated herein by reference in its entirety.

BACKGROUND

This invention relates to compositions useful in the microelectronics industry for cleaning semiconductor wafer substrates. Particularly, this invention relates to alkaline stripping or cleaning compositions containing bath stabilizing agents that are used for cleaning wafers having tungsten metal lines and vias by removing contaminants without damaging the integrated circuits.

Interconnect circuitry in semiconductor circuits consists of conductive metallic circuitry surrounded by insulating dielectric material. In the past, silicate glass vapor-deposited from tetraethylorthosilicate (TEOS) was widely used as the dielectric material, while alloys of aluminum were used for metallic interconnects.

Demand for higher processing speeds has led to smaller sizing of circuit elements, along with the replacement of TEOS and aluminum alloys by higher performance materials. Aluminum alloys have been replaced by copper or copper alloys due to the higher conductivity of copper. TEOS and fluorinated silicate glass (FSG) have been replaced by the so-called low-k dielectrics, including low-polarity materials such as organic polymers, hybrid organic/inorganic materials, organosilicate glass (OSG), and carbon-doped oxide (CDO) glass. The incorporation of porosity, i.e., air-filled pores, in these materials further lowers the dielectric constant of the material.

During dual-damascene processing of integrated circuits, photolithography is used to image a pattern onto a device wafer. Photolithography techniques comprise the steps of coating, exposure, and development. A wafer is coated with a positive or negative photoresist substance and subsequently covered with a mask that defines patterns to be retained or removed in subsequent processes. Following the proper positioning of the mask, the mask has directed therethrough a beam of monochromatic radiation, such as ultraviolet (UV) light or deep UV (DUV) light (≈250 nm or 193 nm), to make the exposed photoresist material more or less soluble in a selected rinsing solution. The soluble photoresist material is then removed, or "developed," thereby leaving behind a pattern identical to the mask.

Thereafter, gas-phase plasma etching is used to transfer the patterns of the developed photoresist coating to the underlying layers, which may include hardmask, interlevel dielectric (ILD), and/or etch stop layers. Post-plasma etch residues are typically deposited on the back-end-of-the-line (BEOL) structures and if not removed, may interfere with subsequent silicidation or contact formation. Post-plasma etch residues typically include chemical elements present on the substrate and in the plasma gases. For example, if a WN hardmask is employed, e.g., as a capping layer over ILD, the post-plasma etch residues include tungsten-containing species, which are difficult to remove using conventional wet cleaning chemistries. Moreover, conventional cleaning chemistries often damage the ILD, absorb into the pores of the ILD thereby increasing the dielectric constant, and/or corrode the metal structures. For example, buffered fluoride and solvent-based chemistries fail to completely remove WN and W-containing residues, while hydroxylamine-containing and ammonia-peroxide chemistries corrode metal lines such as, for example, copper or tungsten.

In addition to the desirable removal of tungsten-containing hardmask and/or tungsten-containing post-plasma etch residue, additional materials that are deposited during the post-plasma etch process such as polymeric residues on the sidewalls of the patterned device and copper-containing residues in the open via structures of the device are also preferably removed. To date, no single wet cleaning composition has successfully removed all of residue and/or hardmask material while simultaneously being compatible with the ILD, other low-k dielectric materials, and metal interconnect materials.

The integration of new materials, such as low-k dielectrics, into microelectronic devices places new demands on cleaning performance. At the same time, shrinking device dimensions reduce the tolerance for changes in critical dimensions and damage to device elements. Etching conditions can be modified in order to meet the demands of the new materials. Likewise, post-plasma etch cleaning compositions must be modified. Importantly, the cleaner should not damage the underlying dielectric material or corrode metallic interconnect materials, e.g., copper, tungsten, cobalt, aluminum, ruthenium, and silicides thereof, on the device.

Towards that end, it is an object of the present invention to provide improved aqueous compositions for the selective and effective removal of tungsten-containing post-plasma etch residue, polymeric sidewall residue, copper-containing via residue and/or tungsten-containing hardmask layers from microelectronic devices, said compositions being compatible with ILD and metal interconnect materials.

It is another object of the present invention to provide improved aqueous compositions having an extended bath-life relative to conventional peroxide-containing cleaning compositions.

SUMMARY OF THE INVENTION

The present invention generally relates to cleaning compositions and methods of using same. One aspect of the invention relates to an oxidizing aqueous composition and process for cleaning post-plasma etch residue and/or tungsten-containing hardmask from microelectronic devices having said residue and/or hardmask thereon, while simultaneously not compromising the metallic and ILD materials on the microelectronic device surface.

The oxidizing aqueous cleaning compositions of the invention include water; an oxidizer comprising an ammonium salt of an oxidizing species; a corrosion inhibitor comprising a primary alkylamine having the general formula: R'NH$_2$, wherein R' is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent.

In another aspect, the invention provides a method of removing a WN hardmask material from a microelectronic device having said WN hardmask thereon and W metal, said method comprising contacting the microelectronic device with an aqueous cleaning composition for sufficient time to at least partially clean said WN hardmask from the microelectronic device, wherein the aqueous cleaning composition includes water; an oxidizer comprising an ammonium salt of an oxidizing species; a corrosion inhibitor comprising a primary alkylamine having the general formula: R'NH$_2$, wherein R' is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent, wherein a WN/W selectivity of >6.0 is achieved.

BRIEF DESCRIPTION OF THE DRAWINGS

The present invention will hereinafter be described in conjunction with the appended figures wherein like numerals denote like elements.

DETAILED DESCRIPTION

Figure 1:
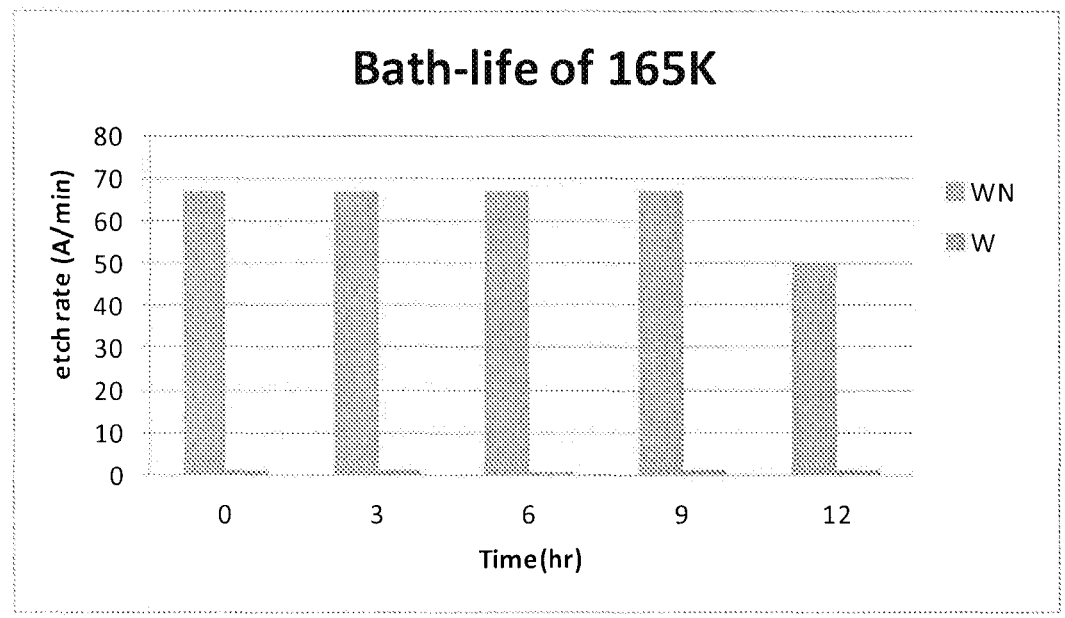
FIG. 1 is graph showing the bath life in terms of the effectiveness of a composition of the present invention in terms of its selectivity for etching WN over W.

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

One aspect the present invention relates to cleaning compositions comprising an ammonium salt of an oxidizing species as an oxidizer and n-octylamine as a corrosion inhibitor. Preferably, the invention relates to oxidizing aqueous compositions for cleaning tungsten-containing post-etch residue, polymeric sidewall residue, metal-containing via and line residue and/or hardmask layers from microelectronic devices having said residue and/or layers thereon, said compositions being compatible with ultra low-k (ULK) dielectric materials, such as OSG and porous-CDO, and the metallic interconnect materials, e.g., copper and tungsten, on the microelectronic device surface.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

"Post-etch residue" and "post-plasma etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, hardmask capping layer material (e.g., tungsten-containing material), nitrogen-containing material, oxygen-containing material, polymeric residue material, copper-containing residue material, etch gas residue such as chlorine and fluorine, and combinations thereof.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "polymeric sidewall residue" corresponds to the residue that remains on the sidewalls of the patterned device subsequent to post-plasma etching processes. The residue is substantially polymeric in nature however, it should be appreciated that inorganic species, e.g., tungsten, silicon and/or copper-containing species, may be present in the residue as well.

As used herein, "about" is intended to correspond to ±5% of the stated value.

As used herein, "suitability" for cleaning tungsten-containing post-etch residue, polymeric sidewall residue, copper-containing via and line residue and/or hardmask layers from a microelectronic device having said residue and/or material thereon corresponds to at least partial removal of said residue and/or material from the microelectronic device. Preferably, at least about 90% of one or more of the materials, more preferably at least 95% of one or more of the materials, and most preferably at least 99% of one or more of the materials, is removed from the microelectronic device using the compositions of the invention.

As used herein, the term "hardmask" or "hardmask capping layer" corresponds to materials deposited over dielectric material to protect same during the plasma etch step. Hardmask capping layers are traditionally silicon nitrides, silicon oxynitrides and other similar compounds. Hardmask capping layers further contemplated herein include tungsten nitride.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Tungsten nitride compounds are notoriously difficult to etch using the peroxide-containing compositions of the prior art. The present inventors discovered a cleaning composition that is devoid of hydrogen peroxide that effectively and selectively removes tungsten-containing residues, tungsten-containing hardmask materials (e.g., tungsten nitride), or both, from the surface of a microelectronic device having same thereon selectively over metals such as, for example, tungsten. In addition, the composition has a substantially longer bath-life relative to the hydrogen peroxide compositions of the prior art and will substantially remove polymeric sidewall residue and copper-containing residue. The compositions of the invention may be formulated to substantially remove the hardmask layer from the surface of the microelectronic device without substantially damaging the underlying low-k dielectric and metal interconnect materials, as described in detail herein.

In one aspect, the present invention relates to an oxidizing cleaning composition for cleaning hardmask layers and/or post-plasma etch residues selected from the group consisting of tungsten-containing residues, polymeric residues, copper-containing residues, and combinations thereof, said composition including water; an oxidizer comprising an ammonium salt of an oxidizing species; a corrosion inhibitor comprising a primary alkylamine having the general formula: $R'NH_2$, wherein $R'$ is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent.

In the broad practice of the invention, the cleaning composition of the present invention may comprise, consist of, or consist essentially of: water; an oxidizer comprising an ammonium salt of an oxidizing species; a corrosion inhibitor comprising a primary alkylamine having the general formula: $R'NH_2$, wherein $R'$ is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent.

Water

The cleaning composition of the present invention is aqueous-based and, thus, comprises water. In the present invention, water functions in various ways such as, for example, to dissolve one or more solid components of the composition, as a carrier of the components, as an aid in the removal of the residue, as a viscosity modifier of the composition, and as a diluent. Preferably, the water employed in the cleaning composition is de-ionized (DI) water.

It is believed that, for most applications, water will comprise, for example, from about 10 to about 90% by wt. of water. Other preferred embodiments of the present invention could comprise from about 18 to about 90% by wt. of water. Yet other preferred embodiments of the present invention could comprise from about 35 to about 60% by wt. of water. Still other preferred embodiments of the present invention could comprise from about 12 to about 25% by wt. of water. Still other preferred embodiments of the present invention could include water in an amount to achieve the desired weight percent of the other ingredients.

Oxidizer

The cleaning composition of the present invention preferably comprises an oxidizer comprising an ammonium salt of an oxidizing species. The oxidizer contemplated herein include, but are not limited to, ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate ($(NH_4)_2S_2O_8$), tetramethylammonium chlorite ($(N(CH_3)_4)ClO_2$), tetramethylammonium chlorate ($(N(CH_3)_4)ClO_3$), tetramethylammonium iodate ($(N(CH_3)_4IO_3)$), tetramethylammonium perborate ($(N(CH_3)_4)BO_3$), tetramethylammonium perchlorate ($(N(CH_3)_4)ClO_4$), tetramethylammonium periodate ($(N(CH_3)_4)IO_4$), tetramethylammonium persulfate ($(N(CH_3)_4)S_2O_8$), and combinations thereof. In preferred embodiments, the oxidizer is or comprises ammonium persulfate.

The concentration of oxidizer in the cleaning compositions of the present invention may range from about 0.1 weight % to about 5 weight % of the total weight of the cleaning composition. In another embodiment, the concentration of the oxidizer may range from about 0.5 weight % to about 2 weight % of the total weight of the cleaning composition. In yet another embodiment, the concentration of the oxidizer may range from about 0.5 weight % to about 1.5 weight % of the total weight of the cleaning composition.

It is contemplated herein that the oxidizer may be added directly to the cleaning composition. One preferred aspect of the invention relates to a composition that comprises ammonium persulfate and may be stored at least 6 hours, more preferably at least 12 hours, even more preferably at least 24 hours, prior to use.

Cleaning compositions according to the present invention are substantially free of hydrogen peroxide.

Corrosion Inhibitor

The cleaning composition of the present invention preferably comprises a corrosion inhibitor comprising a polyamine and/or a primary alkylamine having the general formula: $R'NH_2$, wherein $R'$ is an alkyl group containing up to about 150 carbon atoms and will more often be an aliphatic alkyl group containing from about 4 to about 30 carbon atoms. In one particular embodiment, the primary alkylamine contains from about 4 to about 30 carbon atoms in the alkyl group, and more preferably from about 8 to about 20 carbon atoms in the alkyl group. The alkyl group can be unsubstituted or substituted, such by substituents described above in connection with the hydrocarbyl group, and reference is made thereto.

Representative examples of primary alkylamines include aliphatic primary fatty amines. Typical fatty amines include alkylamines such as n-hexylamine, n-octylamine, n-decylamine, n-dodecylamine, n-tetradecylamine, n-pentadecylamine, n-hexadecylamine, n-octadecylamine (stearyl amine), and the like. The preferred primary alkylamine corrosion inhibitor is n-octylamine.

Representative examples of polyamines include 3,3'-Iminobis(N,N-dimethylpropylamine), Bis(3-aminopropyl) amine, Pentamethyldiethylenetriamine (PMDETA), Polyethylenimine (PEI), and the like. The preferred polyamine is polyethylenimine (PEI).

In certain embodiments of the present invention, a second (i.e., auxiliary) corrosion inhibitor is present to further reduce corrosion of tungsten metal. In such embodiments the second corrosion inhibitor is preferably a carboxyl group-containing organic acid and/or anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, citric acid, acetic anhydride and salicylic acid.

It is believed that for most applications, the corrosion-inhibitor will comprise from about 0.01 to about 5% by weight of the composition; preferably it comprises from about 0.01 to about 4% by weight, most preferably, from about 0.01 about 3% by weight of the composition.

Water-Miscible Solvent

The cleaning composition of the present invention optionally includes one or more water-miscible organic solvents. In various embodiments of the present invention, metal lines on the substrate typically dictate whether a water-miscible organic solvent is used. For example, when aluminum lines are present on a substrate, the combination of water and fluoride ion will typically tend to etch the aluminum. In such embodiments, the use of water-miscible organic solvent can significantly reduce, if not eliminate, etching of aluminum.

Examples of water-miscible organic solvents that can be used are ethylene glycol, propylene glycol, 1,4-butanediol, tripropylene glycol methyl ether, propylene glycol propyl ether, diethylene gycol n-butyl ether (e.g. commercially available under the trade designation Dowanol DB), hexyloxypropylamine, poly(oxyethylene)diamine, dimethylsulfoxide, tetrahydrofurfuryl alcohol, glycerol, alcohols, sulfoxides, or mixtures thereof. Preferred solvents are alcohols, diols, or mixtures thereof. Most preferred solvents are diols such as, for example, propylene glycol.

It is believed that, for most applications, the amount of water-miscible organic solvent, when present, will comprise from about 1 to 75% by weight of the composition. Preferably, the solvent comprises from 5 to about 70% by weight and, most preferably, from about 5% to about 60% by weight of the composition.

Buffering Species

In addition, the cleaning composition of the present invention optionally includes a buffering species to control the pH of the composition, typically to within a range of from about 3 to about 7 and, more typically, from about 3.5 to about 6.5.

The optional buffering species may be included for pH stabilization. Preferably, the buffer includes tetralkylammonium salts of weak acids, wherein the tetralkylammonium salt includes a tetralkylammonium cation represented by $[NR^1R^2R^3R^4]^+$, where $R^1$, $R^2$, $R^3$ and $R^4$ may be the same as or different from one another and are selected from the group consisting of $C_1$-$C_6$ straight-chained or branched alkyl (e.g., methyl, ethyl, propyl, butyl, pentyl, hexyl) or $C_6$-$C_{10}$ substituted or unsubstituted aryl groups (e.g., benzyl), and the weak acid includes: boric acid; and a carboxylic acid such as lactic acid, maleic acid, ascorbic acid, malic acid, benzoic acid, fumaric acid, succinic acid, oxalic acid, malonic acid, mandelic acid, maleic anhydride, acetic, propionic, citric acid, phthalic acid, other aliphatic and aromatic carboxylic acids, as well as combinations of the foregoing acids. Preferably, the buffering species includes a tetramethylammonium salt of citric acid or tetramethylammonium salts of boric acid. Tetraalkylammonium hydroxides that are commercially available may be used for production of the preferred tetralkylammonium salt of a weak acid in combination with the aforementioned acid species. For example, tetraethylammonium hydroxide (TEAH), tetramethyammonium hydroxide (TMAH), tetrapropylammonium hydroxide (TPAH) and tetrabutylammonium hydroxide (TBAH) may be used. Tetraalkylammonium hydroxides which are not commercially available may be prepared in a manner analogous to the published synthetic methods used to prepare TMAH, TEAH, TPAH and TBAH, which are known to one ordinary of skill in the art. Most preferably, the buffering species is included when metal chelating agent(s) are present to stabilize the pH of the composition so that the metal will not erode and so that the peroxide does not decompose rapidly.

In the context of the present invention, maintaining a stable pH is preferred as it is important in achieving extended bath life, i.e., greater than 6.0 hours.

It is believed that for most applications, the buffering agent, will comprise from about 0.05 to about 20% by weight of the composition; preferably, it comprises from about 0.1 to about 15% by weight; most preferably, from about 0.2 to about 10% by weight of the composition.

Other Optional Components

Another optional ingredient that can be used in the cleaning composition is a metal chelating agent; it can function to increase the capacity of the composition to retain metals in solution and to enhance the dissolution of metallic residues. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that, for most applications, the chelating agent will be present in the composition in an amount of from 0 to about 5% by weight, preferably in an amount of from about 0.1 to 2% by weight of the composition.

The cleaning composition of the present invention also optionally comprises one or more sources of fluoride ion. Fluoride ion functions principally to increase the etchrate of the WN hardmask. Typical compounds that provide a fluoride ion source according to the present invention are hydrofluoric acid and salts thereof, ammonium fluoride, quaternary ammonium fluorides such as, for example, tetramethylammonium fluoride and tetrabutylammonium fluoride, fluoroborates, fluoroboric acid, tetrabutylammonium tetrafluoroborate, and aluminum hexafluoride.

In a preferred embodiment, the fluoride ion source is ammonium fluoride; however, when ammonium fluoride is used, it is preferable to remove ammonium ions from the system. Although this can be accomplished by allowing the prepared cleaning composition to stand at room temperature for a long period of time, they can also be removed by heating the solution.

In selecting the source of the fluoride ion, consideration should be given as to whether or not the source would tend to release ions which would tend to affect adversely the surface being cleaned. For example, in cleaning semiconductor elements, the presence of sodium or calcium ions in the cleaning composition can have an adverse effect on the surface of the element.

It is believed that the amount of the compound used as the source of the fluoride ion in the cleaning composition will, for the most applications, comprise, about 0.1 to about 5% by weight. Preferably, the compound comprises from about 0.1 to about 3% by weight and, most preferably, from about 0.1 to about 2.5% by weight. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

Other commonly known components such as dyes, biocides etc. can be included in the cleaning composition in conventional amounts, for example, amounts up to a total of about 5 weight % of the composition.

The cleaning composition of the present invention is typically prepared by mixing the components together in a vessel at room temperature until all solids have dissolved in the aqueous-based medium.

Concentrated oxidizing aqueous cleaning compositions may be diluted when needed (at the fab, etc.) by adding water to the cleaning composition concentrate. The cleaning composition is preferably diluted (water to cleaning composition) in a range from about 0.1:1 to about 20:1, preferably about 1:1 to about 10:1.

The oxidizing aqueous cleaning compositions of the present invention have an extended bath life relative to the peroxide-containing baths of the prior art. Preferably, the bath life is greater than 9 hours at 45° C. As used herein, the term "bath life" generally refers to maintaining the performance of the stripper (e.g., pH, etch rates, residues removal capability) in a bath at a particular process temperature as compared with the performance of a fresh bath.

Further, said cleaning compositions preferably selectively removes WN hardmask and/or post-plasma etch residue from the top surface, the sidewalls, and the vias and lines of the microelectronic device without compromising the ILD and/or the metal interconnect layers present on the device. Another advantage associated with the use of the present invention is that no post-clean bake step is necessary to remove volatile materials that may absorb into the pores of the ILD materials.

The oxidizing aqueous cleaning compositions of the invention are easily formulated by simple addition of the respective ingredients and mixing to homogeneous condition. Furthermore, the oxidizing aqueous cleaning compositions may be readily formulated as single-package formulations or multi-part formulations that are mixed at the point of use, preferably multi-part formulations. The individual parts of the multi-part formulation may be mixed at the tool or in a storage tank upstream of the tool. The concentrations of the respective ingredients may be widely varied in specific multiples of the oxidizing aqueous cleaning composition, i.e., more dilute or more concentrated, in the broad practice of the invention, and it will be appreciated that the oxidizing aqueous cleaning compositions of the invention can variously and alternatively comprise, consist or consist essentially of any combination of ingredients consistent with the disclosure herein.

Performance

Compositions of the present invention surprisingly exhibit excellent WN/N selectivity when used on substrates that include W metal lines and a WN hardmask. The term "selectivity" is typically used to refer to a ratio of etch rates of two materials. Compositions according to the present invention preferably exhibit a wet etch rate WN/W selectivity of >6:1, more preferably exhibit a wet etch rate WN/W selectivity of >10:1, and more preferably exhibit a wet etch rate WN/W selectivity of >50:1.

Compositions of the present invention exhibit the following performance characteristics:
 WN etch rate >50 Å/min
 W etch rate <5 Å/min
 Oxide etch rate <1 Å/min
 WN/W etch rate selectivity >6:1
 Process temp <70° C.
 Bath life >6 hrs Accordingly, in another embodiment, the present invention provides a method of removing a WN hardmask material from a microelectronic device having said WN hardmask thereon and W metal, said method comprising contacting the microelectronic device with an aqueous cleaning composition for sufficient time to at least partially clean said WN hardmask from the microelectronic device, wherein the aqueous cleaning composition includes water; an oxidizer comprising ammonium persulfate; a corrosion inhibitor comprising a primary alkylamine having the general formula: $R'NH_2$, wherein R' is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent, wherein a WN/W selectivity of >6.0 is achieved.

In post-plasma etch cleaning and/or tungsten-containing hardmask removal application, the oxidizing aqueous cleaning composition is applied in any suitable manner to the device to be cleaned, e.g., by spraying the oxidizing aqueous cleaning composition on the surface of the device to be cleaned, by dipping the device to be cleaned in a static or dynamic volume of the oxidizing aqueous cleaning composition, by contacting the device to be cleaned with another material, e.g., a pad, or fibrous sorbent applicator element, that has the oxidizing aqueous cleaning composition absorbed thereon, or by any other suitable means, manner or technique by which the oxidizing aqueous cleaning composition is brought into removal contact with the device to be cleaned. Further, batch or single wafer processing is contemplated herein.

In use of the compositions of the invention for removing post-plasma etch residue from microelectronic devices having same thereon, the oxidizing aqueous cleaning composition typically is contacted with the device for a time of from about 1 minute to about 60 minutes, at temperature in a range of from about 25° C. to about 70° C., preferably about 30° C. to about 60° C. Such contacting times and temperatures are illustrative, and any other suitable time and temperature conditions may be employed that are efficacious to at least partially remove the post-etch residue material and/or hardmask layer from the device, within the broad practice of the invention. "At least partial removal" of residue material and/or hardmask layer from the microelectronic device corresponds to at removal of at least 90% of the material, preferably at least 95% removal. Most preferably, at least 99% of said residue material and/or hardmask layer is removed using the compositions of the present invention.

Following the achievement of the desired removal action, the oxidizing aqueous cleaning composition, which is preferably water miscible, is readily removed from the device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.).

Another aspect of the invention relates to a two-step method of removing post-plasma etch residue material from the surface of the microelectronic device. The first step involves the contacting of the oxidizing aqueous cleaning compositions of the invention with the device for a time of from about 1 minute to about 60 minutes, at temperature in a range of from about 25° C. to about 70° C., preferably about 30° C. to about 60° C. Thereafter, the device is contacted with a dilute hydrofluoric acid composition at temperature in a range from about 20° C. to about 25° C. for 15 seconds to about 60 seconds. The dilute hydrofluoric acid composition may have a dilution in a range from about 100:1 to about 1000:1 (water to HF), preferably about 400:1 to about 600:1. Preferably, the device is rinsed with a rinse composition, e.g., deionized water, subsequent to contact with the oxidizing aqueous cleaning composition and before contact with the dilute HF.

Examples

General Procedure for Preparing the Cleaning Compositions

All compositions which are the subject of the present Examples were prepared by mixing 500 g of material in a 600 mL beaker with a 1" Teflon-coated stir bar. The components can then be added in any order.

Etch Rate Measurement

For the following Examples, etch rate measurements were determined as follows:

The etch rates were measured from 40° C. to 65° C. within a 3 minute time frame. The W and WN etch rates were measured by 4 point probe and TEOS film was measured by ellipsometer. The etch rates were calculated by the thickness difference before and after treatment divided by immersion time.

Example Compositions

TABLE 1

Evaluation of Tungsten Corrosion Inhibitor

|  | 148A | 148B | 148D | 148E | 148F | 149B* | 149A | 148Q |
|---|---|---|---|---|---|---|---|---|
| APS | 2 | 2 | 2 | 2 | 2 | 2 | 2 | 2 |
| H2O | 95 | 30 | 95 | 95 | 95 | 94.5 | 91.5 | 88.5 |
| amm acetate | 3 | 3 | 3 | 3 | 3 | 3 | 6 | 9 |
| PG |  | 60 |  |  |  |  |  |  |
| lupasol |  |  | 0.15 | 0.5 |  |  |  |  |
| CTAB |  |  |  |  | 0.2 |  |  |  |
| Octyl-amine |  |  |  |  |  | 0.5 | 0.5 | 0.5 |
| WN ER | >100 |  |  | 0.7 | >67 |  |  |  |
| W ER | 58 | 103 | 51.7 | 0.3 | 34.7 | 10 | 25 | 36 |
| WN/N selectivity | >1.7 |  |  |  | >6.7 |  |  |  |
| Oxide ER |  |  |  |  | <1 |  |  |  |
| Process temp (C.) | 60 | 60 | 60 | 60 | 60 | 55 | 55 | 55 |

TABLE 2

Evaluation of tungsten corrosion inhibitor.

|  | 161M | 161L | 161K | 161J | 161I | 161N | 161O | 161P | 161Q |
|---|---|---|---|---|---|---|---|---|---|
| APS | 4 | 4 | 4 | 4 | 4 | 4 | 4 | 4 | 4 |
| amm acetate | 1.3 | 1.3 | 1.3 | 1.3 | 1.3 | 1.3 | 1.3 | 1.3 | 1.3 |
| acetic acid | 1 | 1 | 1 | 1 | 1 | 1 | 1 | 1 | 1 |
| Octylamine | 0 | 0.3 | 0 | 0.3 | 0.3 | 0.3 | 0.3 | 0.3 | 0.3 |
| DIW | 93.7 | 93.4 | 92.7 | 92.4 | 92.9 | 92.4 | 92.4 | 92.4 | 92.4 |
| citric acid |  |  | 1 | 1 | 0.5 |  |  |  |  |
| malonic acid |  |  |  | 1 |  |  |  |  |  |
| IDA |  |  |  |  |  | 1 |  |  |  |
| Adipic acid |  |  |  |  |  |  | 1 |  |  |
| H2SO4 |  |  |  |  |  |  |  |  | 0.45 |
| pH | 4.75 | 4.88 | 4.27 | 4.43 | 4.63 | 4.3 | 4.48 | 4.6 | 4.4 |
| WN ER | >67 | >67 | >67 | >67 | >67 | >67 | >67 | 39.3 | 49.6 |
| W E/R | 64.4 | 25.83333 | 64.2 | 5 | 10.86 | 1.26 | 19.8 | 5.8 | 1.16 |
| Process temp (C.) | 50 | 50 | 50 | 50 | 50 | 50 | 50 | 50 | 50 |

With the help of organic acids, W etch rate could be reduced further. Thus, organic acids could be employed as auxiliary W corrosion inhibitors.

Preferred Composition

The following composition is preferred.

| Formulation 165K | |
|---|---|
|  | 165K |
| APS | 3 |
| amm acetate | 1.3 |
| acetic acid | 1 |
| octylamine | 0.3 |
| DIW | 91.4 |
| TEAH (35%) | 3 |

Figure 2:
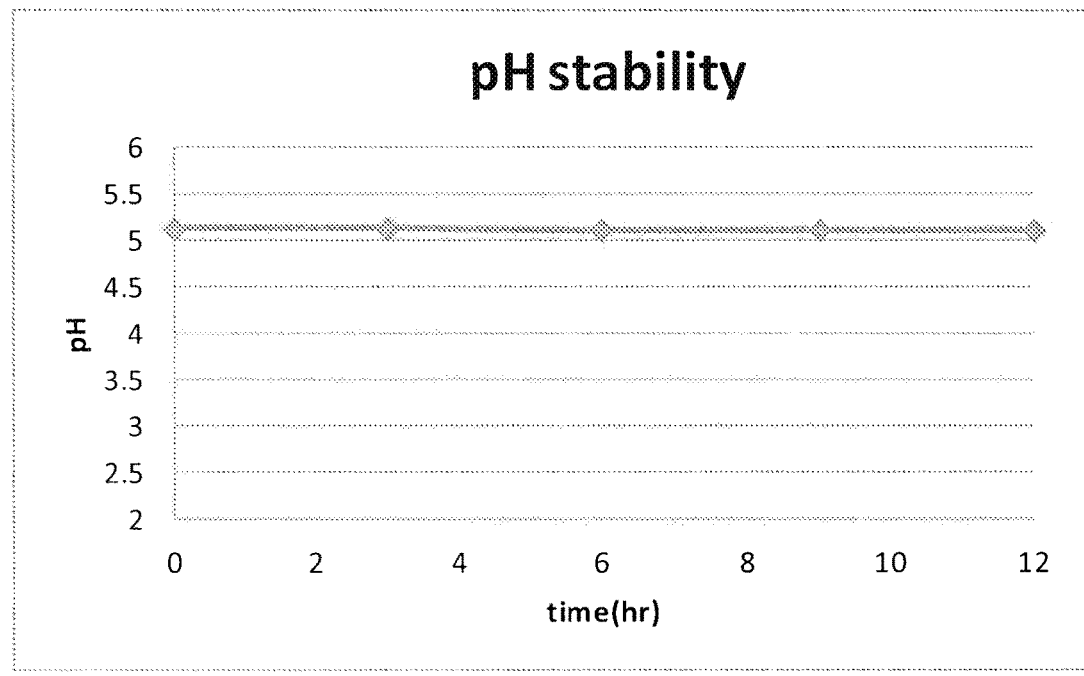
FIG. 2 is a graph showing the pH stability of the bath shown in FIG. 1.

Referring to FIGS. 1 and 2, it can be seen that maintaining a stable pH is important for bath-life extension. Formulation 165K exhibits promising WN etching power and maintains high WN/W selectivity. The bath-life of 165K is higher than 9 hr at 45° C.

Effect of Fluoride Ion

The following data shows that adding fluoride ions to compositions comprising ammonium persulfate boost the WN etch rate.

TABLE 3

Effect of Fluoride on WN Etch Rate

|  | 163A | 164B | 164C | 164D | 164H |
|---|---|---|---|---|---|
| APS | 3 | 3 | 3 | 3 | 3 |
| amm acetate | 1.3 | 1.3 | 1.3 | 1.3 | 1.3 |
| acetic acid | 1 | 1 | 1 | 1 | 1 |
| octylamine | 0.3 | 0.3 | 0.3 | 0.3 | 0.3 |
| DIW | 94.4 | 94.25 | 93.9 | 94 | 94.15 |
| Ammonium Bifluoride |  | 0.15 |  |  |  |
| NH4F (40%) |  |  | 0.5 | 0.4 |  |
| HF (49%) |  |  |  |  | 0.25 |
| pH | 4.64 | 4.51 | 4.65 | 4.64 | 4.31 |
| WN E/R | 43.4 | >67 | 63.6 | 64.34 | >67 |
| W E/R | 8.8 | 15 | 17.67 | 3.67 | 20.7 |
| Process temp (C.) | 45 | 45 | 45 | 45 | 45 |

While the principles of the invention have been described above in connection with preferred embodiments, it is to be clearly understood that this description is made only by way of example and not as a limitation of the scope of the invention.

The invention claimed is:

1. A system for cleaning integrated circuit substrates, comprising:
   1) the integrated circuit substrates comprising WN hardmask material;
   2) a cleaning composition comprising:
      a. water;
      b. an oxidizer comprising an ammonium salt of an oxidizing species;
      c. a corrosion inhibitor selected from the group consisting of a primary alkylamine having the general formula: R'NH$_2$, wherein R' is an alkyl group containing up to about 150 carbon atoms and will more often be an aliphatic alkyl group containing from about 4 to about 30 carbon atoms; polyamine selected from the group consisting of 3'-Iminobis(N,N-dimethylpropylamine), Bis(3-aminopropyl)amine, Pentamethyldiethylenetriamine (PMDETA), Polyethyleneimine (PEI), and combinations thereof; and combinations thereof;
      d. optionally, a water-miscible organic solvent;
      e. optionally, an organic acid;
      f. optionally, a buffer species;
      g. optionally, a fluoride ion source; and
      h. optionally, a metal chelating agent;
   wherein the cleaning composition is in contact with the WN hardmask material to remove the WN hardmask material.

2. The system of claim 1, wherein the cleaning composition has a pH of from 3.0 to 6.5.

3. The system of claim 1 wherein the ammonium salt of an oxidizing species is selected from the group consisting of ammonium chlorite (NH$_4$ClO$_2$), ammonium chlorate (NH$_4$ClO$_3$), ammonium iodate (NH$_4$IO$_3$), ammonium perborate (NH$_4$BO$_3$), ammonium perchlorate (NH$_4$ClO$_4$), ammonium periodate (NH$_4$IO$_3$), ammonium persulfate ((NH$_4$)$_2$S$_2$O$_8$), tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$), and combinations thereof.

4. The system of claim 3 wherein the ammonium salt of an oxidizing species is ammonium persulfate.

5. The system of claim 1 wherein the buffer species is present and comprises a tetralkylammonium salt of a weak acid, wherein
   the tetralkylammonium salt comprises a tetralkylammonium cation represented by [NR$^1$R$^2$R$^3$R$^4$]$^+$, where R$^1$, R$^2$, R$^3$ and R$^4$ may be the same as or different from one another and are selected from the group consisting of C$_1$-C$_6$ straight-chained or branched alkyl or C$_6$-C$_{10}$ substituted or unsubstituted aryl groups, and
   the weak acid is selected from the group consisting of boric acid, lactic acid, maleic acid, ascorbic acid, malic acid, benzoic acid, fumaric acid, succinic acid, oxalic acid, malonic acid, mandelic acid, maleic anhydride, acetic, propionic, citric acid, phthalic acid, an aromatic carboxylic acid, and combinations thereof.

6. The system of claim 5 wherein the buffer species is a tetramethylammonium salt of citric acid or a tetramethylammonium salt of boric acid.

7. The system of claim 1 wherein the corrosion inhibitor is selected from the group consisting of n-hexylamine, n-octylamine, n-decylamine, n-dodecylamine, n-tetradecylamine, n-pentadecylamine, n-hexadecylamine, and n-octadecylamine (stearyl amine).

8. The system of claim 7 wherein the corrosion inhibitor is n-octylamine.

9. The system of claim 1 wherein the corrosion inhibitor is Polyethyleneimine.

10. The system of claim 1 wherein the water-miscible organic solvent is present and is selected from the group consisting of ethylene glycol, propylene glycol, 1,4-butanediol, tripropylene glycol methyl ether, propylene glycol propyl ether, diethylene glycol n-butyl ether, hexyloxypropylamine, poly(oxyethylene)diamine, dimethylsulfoxide, tetrahydrofurfuryl alcohol, glycerol, alcohols, sulfoxides, and mixtures thereof.

11. The system of claim 10 wherein the water-miscible organic solvent is a diol.

12. The system of claim 1 wherein the metal chelating agent is present and is selected from the group consisting of (ethylenedinitrilo)tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine.

13. The system of claim 12 wherein the metal chelating agent is selected from the group consisting of EDTA, CyDTA, and EDTMP.

14. The system of claim 1 wherein the fluoride ion source is present and is selected from the group consisting of hydrofluoric acid and/or salts thereof, ammonium fluoride, tetramethylammonium fluoride, tetrabutylammonium fluoride, fluoroborates, fluoroboric acid, tetrabutylammonium tetrafluoroborate, and aluminum hexafluoride.

15. A composition for cleaning integrated circuit substrates, the composition consisting of:
   from about 12 to about 25% by wt. of water;
   from about 0.50 to about 2.0% by wt. of an oxidizer comprising an ammonium salt of an oxidizing species;
   from about 0.01 to about 3.0% by wt. of a corrosion inhibitor selected from a group consisting of n-hexylamine, n-octylamine, n-decylamine, n-dodecylamine, n-tetradecylamine, n-pentadecylamine, n-hexadecylamine, and n-octadecylamine (stearyl amine);
   from about 5 to about 60% by wt. of a water-miscible organic solvent;
   from about 0.2 to about 10% by weight of a buffer species; and
   from about 0.1 to about 3% by wt. of a fluoride ion source.

16. The composition of claim 15 having a pH of from 3.0 to 6.5.

17. The composition of claim 15 wherein the ammonium salt of an oxidizing species is selected from the group consisting of ammonium chlorite (NH$_4$ClO$_2$), ammonium chlorate (NH$_4$ClO$_3$), ammonium iodate (NH$_4$IO$_3$), ammonium perborate (NH$_4$BO$_3$), ammonium perchlorate (NH$_4$ClO$_4$), ammonium periodate (NH$_4$IO$_3$), ammonium persulfate ((NH$_4$)$_2$S$_2$O$_8$), tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ($(N(CH_3)_4)IO_4$), tetramethylammonium persulfate ($(N(CH_3)_4)S_2O_8$), and combinations thereof.

18. The composition of claim 17 wherein the ammonium salt of an oxidizing species is ammonium persulfate.

19. The composition of claim 15 wherein the buffer species comprises a tetralkylammonium salt of a weak acid, wherein
the tetralkylammonium salt comprises a tetralkylammonium cation represented by $[NR^1R^2R^3R^4]\pm$, where $R^1$, $R^2$, $R^3$ and $R^4$ may be the same as or different from one another and are selected from the group consisting of $C_1$-$C_6$ straight-chained or branched alkyl or $C_6$-$C_{10}$ substituted or unsubstituted aryl groups, and
the weak acid is selected from the group consisting of boric acid, lactic acid, maleic acid, ascorbic acid, malic acid, benzoic acid, fumaric acid, succinic acid, oxalic acid, malonic acid, mandelic acid, maleic anhydride, acetic, propionic, citric acid, phthalic acid, an aromatic carboxylic acid, and combinations thereof.

20. The composition of claim 19 wherein the buffer species is a tetramethylammonium salt of citric acid or a tetramethylammonium salt of boric acid.

21. The composition of claim 15 wherein the corrosion inhibitor is n-octylamine.

22. The composition of claim 15 wherein the water-miscible organic solvent is selected from the group consisting of ethylene glycol, propylene glycol, 1,4-butanediol, tripropylene glycol methyl ether, propylene glycol propyl ether, diethylene glycol n-butyl ether, hexyloxypropylamine, poly(oxyethylene)diamine, dimethylsulfoxide, tetrahydrofurfuryl alcohol, glycerol, alcohols, sulfoxides, and mixtures thereof.

23. The composition of claim 22 wherein the water-miscible organic solvent is a diol.

24. The composition of claim 15 wherein the fluoride ion source is selected from the group consisting of hydrofluoric acid and/or salts thereof, ammonium fluoride, tetramethylammonium fluoride, tetrabutylammonium fluoride, fluoroborates, fluoroboric acid, tetrabutylammonium tetrafluoroborate, and aluminum hexafluoride.

25. A method of removing a WN hardmask material from a microelectronic device having said WN hardmask thereon and W metal, said method comprising contacting the microelectronic device with an aqueous cleaning composition for sufficient time to at least partially clean said WN hardmask from the microelectronic device, wherein the aqueous cleaning composition comprises water; an oxidizer comprising an ammonium salt of an oxidizing species; a corrosion inhibitor comprising a primary alkylamine having the general formula: $R'NH_2$, wherein R' is an alkyl group containing up to about 150 carbon atoms and will more often be an aliphatic alkyl group containing from about 4 to about 30 carbon atoms; optionally, a water-miscible organic solvent; optionally, an organic acid; optionally, a buffer species; optionally, a fluoride ion source; and optionally, a metal chelating agent, wherein a WN/W selectivity of >6.0 is achieved.

26. The method of claim 25, wherein the contacting comprises a process selected from the group consisting of: spraying the aqueous composition on a surface of the microelectronic device; dipping the microelectronic device in a sufficient volume of aqueous composition; contacting a surface of the microelectronic device with another material that is saturated with the aqueous composition; and contacting the microelectronic device with a circulating aqueous composition.

27. The method of claim 25, further comprising rinsing the microelectronic device with deionized water following contact with the aqueous composition.

28. The method of claim 27, further comprising contacting the microelectronic device with dilute hydrofluoric acid.

29. The method of claim 25 wherein the composition has a pH of from 3.0 to 6.5.

\* \* \* \* \*